United States Patent
Ernst et al.

(10) Patent No.: US 6,862,702 B2
(45) Date of Patent: Mar. 1, 2005

(54) ADDRESS COUNTER FOR ADDRESSING SYNCHRONOUS HIGH-FREQUENCY DIGITAL CIRCUITS, IN PARTICULAR MEMORY DEVICES

(75) Inventors: Wolfgang Ernst, München (DE);
Gunnar Krause, München (DE);
Justus Kuhn, München (DE); Jens Lüpke, München (DE); Jochen Müller, München (DE); Peter Pöchmüller, München (DE); Michael Schittenhelm, Poing (DE)

(73) Assignee: Infineon Technologies AG, Munich (DE)

(*) Notice: Subject to any disclaimer, the term of this patent is extended or adjusted under 35 U.S.C. 154(b) by 555 days.

(21) Appl. No.: 09/907,776

(22) Filed: Jul. 18, 2001

(65) Prior Publication Data

US 2002/0012286 A1 Jan. 31, 2002

(30) Foreign Application Priority Data

Jul. 18, 2000 (DE) .......................................... 100 34 897

(51) Int. Cl.⁷ ............................................. G11C 29/00
(52) U.S. Cl. ...................... 714/718; 711/200; 365/236
(58) Field of Search ................................ 714/702, 718, 714/722, 730, 738, 739; 711/219, 220; 340/799, 723, 724, 730, 747, 75; 365/236

(56) References Cited

U.S. PATENT DOCUMENTS 4,779,084 A * 10/1988 Tanaka et al. ............... 345/574
5,657,466 A * 8/1997 Yazawa ....................... 711/220

* cited by examiner

Primary Examiner—Guy J. Lamarre
Assistant Examiner—John J. Tabone, Jr.
(74) Attorney, Agent, or Firm—Laurence A. Greenberg; Werner H. Stemer; Gregory L. Mayback

(57) ABSTRACT

The novel address counter can be used in combination with an existing test unit—serving for testing digital circuits—for addressing synchronous high-frequency digital circuits, in particular fast memory devices. Address offset values are provided in programmable offset registers, with a multiplexer circuit and a selection and combination circuit, on the basis of input signals which are fed in at low frequency and in parallel by the test unit. Simple address changes and address jumps can be realized at a high clock frequency in a very flexible manner.

10 Claims, 1 Drawing Sheet

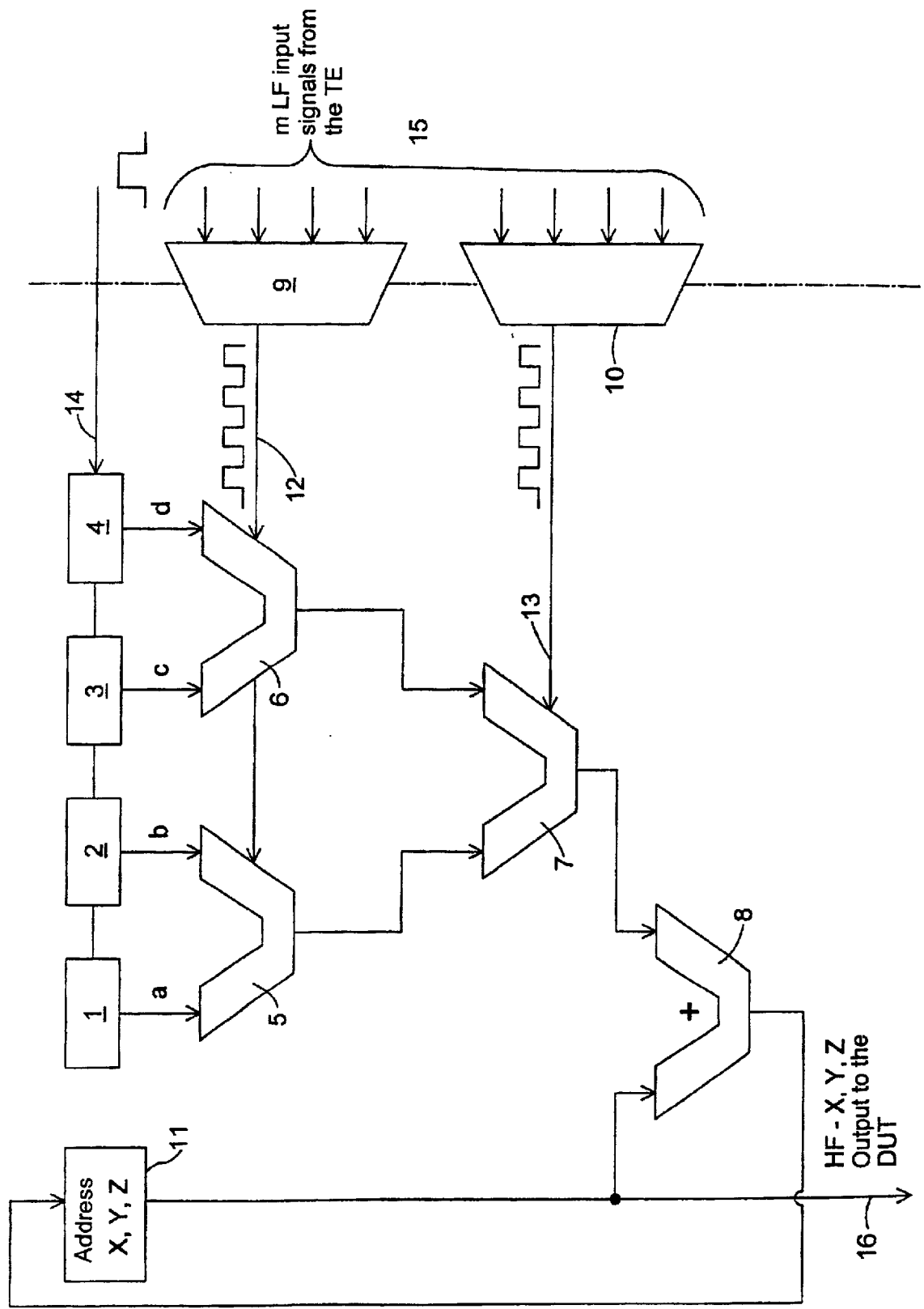

ADDRESS COUNTER FOR ADDRESSING SYNCHRONOUS HIGH-FREQUENCY DIGITAL CIRCUITS, IN PARTICULAR MEMORY DEVICES

BACKGROUND OF THE INVENTION

Field of the Invention

The invention relates to an address counter in combination with a test unit for addressing and for testing synchronous high-frequency digital circuits, in particular memory devices, which generates column and row address signals at the operating frequency of the digital circuit.

The production testing of high-frequency digital circuits requires an address counter which generates the column and row addresses needed during the test. In order to test the functionality of the digital circuit to be tested and eliminate defective circuits during production, the address signals have to be provided at the high operating frequency of the digital circuit. By way of example, in synchronous DRAMs, a new address can be applied in each clock cycle.

Unfortunately, the maximum signal frequency of modern conventional test units or test systems lies below the maximum permissible clock frequency of the very latest high frequency digital circuits, in particular memory modules.

SUMMARY OF THE INVENTION

It is accordingly an object of the invention to provide an address counter for addressing synchronous high-frequency digital circuits, which overcomes the above-mentioned disadvantages of the heretofore-known devices and methods of this general type and which provides for an address generator such that the test unit which has been used hitherto for the production test and whose signal frequency is significantly lower than the operating frequency of the module to be tested can continue to be used for the production testing of high-frequency digital circuits, in particular memory modules, in such a way that the addressing can be carried out at the high frequency of the digital circuit.

With the foregoing and other objects in view there is provided, in accordance with the invention, an address counter in combination with a test unit for addressing and for testing synchronous high-frequency digital circuits, such as memory devices, which generates column and row addresses at the operating frequency of the digital circuit, the address counter comprising:

a number n offset registers for storing n address offset values, the offset registers each having an output;

a selection and combination circuit connected to the outputs of the offset registers and serving for controllable selection of the address offset values stored in the offset registers and generation of high-frequency output addresses for the digital circuit to be tested; and a control circuit connected to and controlling the selection and combination circuit, the control circuit receiving a number m low-frequency input signals from the test unit and generating therefrom n high-frequency control signals for driving the selection and combination circuit and a selection of the address offset values of the offset registers.

The offset registers may be programmable offset registers or fixed offset registers.

In other words, the addresses are counted by way of an addition of the contents of programmable and/or fixed offset registers to the row and/or column address respectively present. The input of the address counter is driven by the test unit at low frequency. The selection of the offset registers is undertaken by a selection and combination circuit which is driven by high-frequency control signals. At the input of the address counter there is a multiplexer which generates n high-frequency control signals on the basis of m low-frequency input signals provided by the test unit. The frequency multiplication factor results from the ratio of the number m of inputs to the number n of control signals required for selection of the offset registers.

With the aid of freely programmable offset registers, both simple address changes (incrementing or decrementing of addresses) and address jumps can be realized at high clock frequency in a very flexible manner.

In accordance with an added feature of the invention, the offset registers are four offset registers and the control circuit includes two multiplexers for frequency quadrupling and selection of four address offset values stored in the four offset registers.

In accordance with an additional feature of the invention, the m low-frequency input signals are provided in parallel by the test unit.

In accordance with another feature of the invention, the address counter is implemented as a semiconductor circuit formed separate from the test unit, and the offset registers can be programmed or loaded by the test unit.

In accordance with again another feature of the invention, the address counter is implemented as part of a semiconductor circuit connected between the test unit and the digital circuit to be tested and spatially and functionally assigned to the digital circuit.

With the above and other objects in view there is also provided, in accordance with a concomitant feature of the invention, a testing method, which comprises the following steps: providing a plurality of high-frequency synchronous DRAM modules, connecting an address counter as summarized above to each of the high-frequency synchronous DRAM modules, and testing the high-frequency synchronous DRAM modules in parallel by driving the address counters with one test unit.

The novel address counter is preferably realized as a semiconductor circuit which is separate from the test unit and is connected between the test unit and the digital circuit (in particular the semiconductor memory module) to be tested. Consequently, using the address counter according to the invention, high-frequency address signals can be generated from m low-frequency input signals made available by the test unit.

In this way, in order to generate address signals which are required for driving high-frequency digital circuits, in particular memory modules, instead of a high-frequency and expensive test system, a low-frequency test system or unit can be used whose m test address signals made available at low frequency are serialized at high frequency by means of multiplexers.

The address counter according to the invention obviates the purchasing of new expensive high-frequency test systems and, when testing high-frequency digital circuits, in particular memory modules operated at high clock frequency, avoids the risk of defects remaining undiscovered, since the digital circuits or memory modules can be addressed at the high frequency corresponding to their specification.

Other features which are considered as characteristic for the invention are set forth in the appended claims.

Although the invention is illustrated and described herein as embodied in an address counter for addressing synchronous high-frequency digital circuits, in particular memory devices, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The sole FIGURE of the drawing is a schematic block diagram of an exemplary embodiment of the address counter according to the invention.

DESCRIPTION OF THE PREFERRED EMBODIMENTS

The address counter shown in the FIGURE has four programmable offset registers 1, 2, 3 and 4, into which the contents a, b, c and d, for example, are set. From a test unit TE, for the purpose of selecting the contents a–d of these four offset registers 1–4, m, for example eight, parallel input signals 15 at low frequency are fed in, which are converted by a respective 4:1 multiplexer 9 and 10 into high-frequency control signals 12, 13 for driving a selection circuit which comprises multiplexers 5, 6 and 7 and receives the outputs a, b, c and d of the offset registers 1, 2, 3 and 4. The address offset value a, b, c or d selected by the multiplexers 5, 6 and 7 forming the selection circuit is applied to an input of a combination element 8, which is an adder for example. At a second input, the adder 8 receives a current address x, y, z from an address register 11 and adds to the current address in each case the offset value a, b, c or d originating from one of the offset registers 1–4. The output of the address register 11 for the current address simultaneously forms the high-frequency addressing output 16 to the digital circuit DUT to be tested, for example to a synchronous DRAM to be tested. In this way, the address signals generated by the address counter can be provided at the operating frequency of the digital circuit, in particular the memory module, even though the low-frequency input signals 15 originating from the test unit TE have a frequency that is four times lower.

Since the offset registers 1–4 are preferably freely programmable, they can be used to implement both simple address changes (successive incrementing) and address jumps at high clock frequency in a very flexible manner. A programming line 14 feeds in the data that are to be set into the offset registers 1–4, for example from the test unit TE.

It should be noted that the exemplary embodiment—illustrated in the figure—of an address counter according to the invention realizes merely by way of example frequency quadrupling and selection from four offset registers. An address counter of this type can be realized in the form of a semiconductor circuit which, for example, is part of a semiconductor circuit which is connected between a test unit and a memory module and is separate from the test unit, also called BOST (Build Outside Self Test). Additional information concerning such test systems may be found in several of our copending patent applications, including application No. (attorney docket number MUH-11524), the disclosure of which is herewith incorporated by reference. This semiconductor circuit, with the address counter according to the invention, can "refine" existing test units, which have only an inadequate temporal accuracy and, in comparison with the digital modules, in particular memory modules, to be tested, have only a low clock frequency, such that very flexible address generation, the order of which can be programmed as desired, is thus achieved for the digital circuits to be tested.

According to the above statements, the address counter according to the invention enables an inexpensive, already existing, low-frequency test unit to be used for a nonetheless reliable test by addressing high-frequency digital circuits.

We claim:

1. An address counter in combination with a test unit for addressing and f or testing synchronous high-frequency digital circuits, for generating column and row addresses at an operating frequency of the digital circuit, the address counter comprising:

a number n of offset registers for storing n address offset values, said off set registers each having an output;

a selection and combination circuit connected to said outputs of said offset registers and serving for controllable selection of the address offset values stored in said offset registers and generation of high-frequency output addresses for the digital circuit to be tested; and a control circuit connected to and controlling said selection and combination circuit, said control circuit receiving a number m of low-frequency input signals from the test unit and generating therefrom n high-frequency control signals for driving said selection and combination circuit to select in correspondence to said m low-frequency input signals the address offset values as output addresses from said offset registers, the address counter generating said output addresses with a high frequency determined by a ratio of the number m of said input signals to the number n of said control signals required for selection of said offset registers.

2. The address counter according to claim 1, wherein the digital circuits to be tested are memory devices.

3. The address counter according to claim 1, wherein said offset registers are programmable offset registers.

4. The address counter according to claim 1, wherein said offset registers are fixed offset registers.

5. The address counter according to claim 1, wherein said offset registers are four offset registers and said control circuit includes two multiplexers for frequency quadrupling and selection of four address offset values stored in said four offset registers.

6. The address counter according to claim 1, wherein the m low-frequency input signals are provided in parallel by the test unit.

7. The address counter according to claim 1 implemented as a semiconductor circuit formed separate from the test unit, wherein said offset registers are programmable by the test unit.

8. The address counter according to claim 1 implemented a semiconductor circuit formed separate from the test unit, wherein said offset registers are loadable by the test unit.

9. The address counter according to claim 1 implemented a part of a semiconductor circuit connected between the test unit and the digital circuit to be tested and spatially and functionally assigned to the digital circuit.

10. A testing method, comprising: providing a plurality of high-frequency synchronous DRAM modules, connecting an address counter according to claim 1 to each of the high-frequency synchronous DRAM modules, and testing the high-frequency synchronous DRAM modules in parallel by driving the address counters with one test unit.

* * * * *